United States Patent
Lettow (10) Patent No.: US 9,447,251 B2
(45) Date of Patent: Sep. 20, 2016

(54) ARTICLES HAVING A COMPOSITIONAL GRADIENT AND METHODS FOR THEIR MANUFACTURE

(75) Inventor: John S. Lettow, Washington, DC (US)

(73) Assignee: VORBECK MATERIALS CORP., Jessup, MD (US)

( * ) Notice: Subject to any disclaimer, the term of this patent is extended or adjusted under 35 U.S.C. 154(b) by 425 days.

(21) Appl. No.: 13/002,304

(22) PCT Filed: Jun. 30, 2009

(86) PCT No.: PCT/US2009/049262
§ 371 (c)(1),
(2), (4) Date: Mar. 31, 2011

(87) PCT Pub. No.: WO2010/002896
PCT Pub. Date: Jan. 7, 2010

(65) Prior Publication Data
US 2012/0103670 A1    May 3, 2012

(51) Int. Cl.
| | | |
|---|---|---|
| *C08K 3/00* | (2006.01) | |
| *C01B 31/04* | (2006.01) | |
| *F28F 21/02* | (2006.01) | |
| *H01L 23/373* | (2006.01) | |
| *B82Y 30/00* | (2011.01) | |
| *C08J 5/00* | (2006.01) | |
| *C08L 21/00* | (2006.01) | |

(52) U.S. Cl.
CPC ............. *C08K 3/0033* (2013.01); *B82Y 30/00* (2013.01); *C01B 31/0438* (2013.01); *C01B 31/0484* (2013.01); *C08J 5/005* (2013.01); *F28F 21/02* (2013.01); *H01L 23/3733* (2013.01); *H01L 23/3737* (2013.01); *C08L 21/00* (2013.01); *Y10T 428/24942* (2015.01)

(58) Field of Classification Search
CPC . F28F 21/02; H01L 23/3733; H01L 23/3737
USPC ...................... 428/195.1, 210; 165/146, 185
See application file for complete search history.

(56) References Cited

U.S. PATENT DOCUMENTS

| | | | |
|---|---|---|---|
| 6,503,626 B1 * | 1/2003 | Norley et al. | 428/408 |
| 2002/0197923 A1 * | 12/2002 | Tobita et al. | 442/74 |
| 2007/0265379 A1 * | 11/2007 | Chen et al. | 524/404 |
| 2008/0048364 A1 * | 2/2008 | Armeniades et al. | 264/328.1 |
| 2011/0086206 A1 * | 4/2011 | Scheffer et al. | 428/195.1 |

OTHER PUBLICATIONS

Ramanathan et al. "Functionalized graphene sheets for polymer nanocomposites", Nature Nanotechnology, 2008, vol. 3, p. 327-331.*
Additional information for Ramanathan et al. "Functionalized graphene sheets for polymer nanocomposites", Nature Nanotechnology, 2008, vol. 3, p. 327-331. Acquired on Feb. 21, 2014.*

* cited by examiner

*Primary Examiner* — Gerard Higgins
(74) *Attorney, Agent, or Firm* — Vorbeck Materials Corp.; Kate Redmond; Trentice V. Bolar (57) ABSTRACT

Articles comprising a composition comprising a polymeric binder and at least one carbonaceous filler, wherein the article has a compositional gradient such that the concentration of the filler is increased or decreased in at least one direction in the article. Methods for their preparation and structures comprising the articles are also described.

18 Claims, 3 Drawing Sheets

ARTICLES HAVING A COMPOSITIONAL GRADIENT AND METHODS FOR THEIR MANUFACTURE

FIELD OF THE INVENTION

The present invention relates to articles comprising a compositional gradient of a carbonaceous material and methods for their preparation.

BACKGROUND

Additives are often used to impart polymeric materials with certain desirable properties. For example, electrically conductive fillers can be used in applications where static dissipation or greater degrees of electrical conductivity are important. Other fillers can be used to increase the permeation resistance of a material to certain gases or liquids. However, in some cases, such as at loadings required to optimize the desired properties (for example, to go over the percolation threshold for electrical conductivity), the use of such additives can be detrimental to other desired characteristics (such as mechanical properties) of the materials and/or can be costly. However, it is often not necessary that the additives be dispersed uniformly throughout the material. For example, when electrical conductivity is needed, it is often only necessary that the portions of an articles near its surface be conductive. Furthermore, when additives that increase the permeation resistance of a polymeric material are uniformly dispersed throughout the matrix, larger amounts are often needed to get the desired effect, whereas if a lesser amount were to be concentrated in one thinner portion of the article, it could be possible to obtain the same effect.

Since the methods typically used to prepare polymer articles, such as, for example, melt processing and casting, involve intermediate states of the materials (such as melts, solutions, suspensions, and the like) in which the polymer and any additives are at least somewhat uniformly blended, the resulting products will generally comprise a uniform dispersion of the additives in the polymer matrix. It is possible to prepare articles in which additives are concentrated in a particular area by making laminates or the like, but these require the use of multiple processing steps, which can add complexity and cost.

It would thus be desirable to obtain monolithic polymeric composite articles in which additives were present in the form of the gradient, viz., that they were concentrated in a particular portion of the article.

U.S. Pat. No. 5,464,585 discloses a process for molding articles having a bulk material and an auxiliary material present in the bulk material as a fixed concentration strip or in a concentration gradient in the direction from the surface to the interior.

SUMMARY OF THE INVENTION

Disclosed and claimed herein are articles comprising a composition comprising at least one polymeric binder and at least one carbonaceous filler, having a compositional gradient wherein the concentration of the filler is increased or decreased in at least one direction of the article. Further disclosed and claimed herein are methods for making the articles and structures containing the articles.

DETAILED DESCRIPTION OF THE INVENTION

Figure 1:
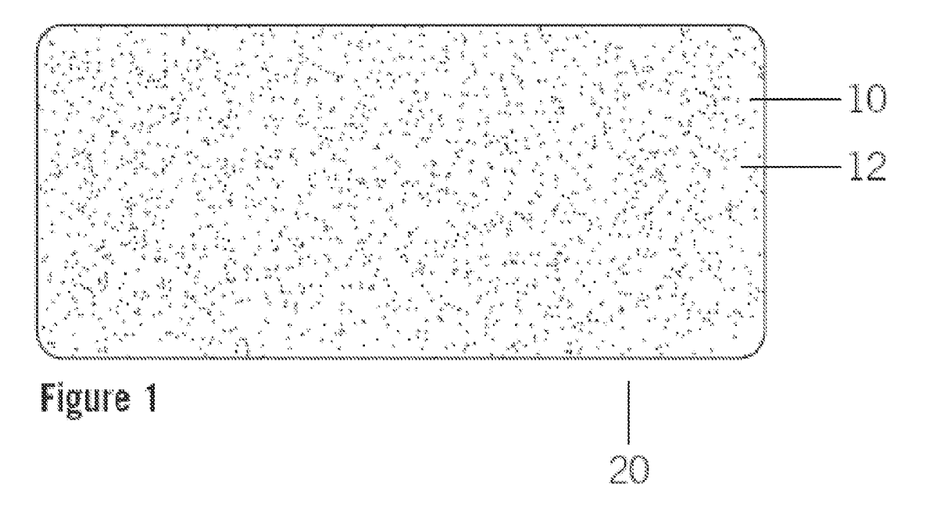
FIG. 1 is an idealized cross-sectional view of a typical article comprising a filled compositions.

The articles of the present invention comprise at least one polymeric binder (referred to herein as the "matrix") and at least one carbonaceous filler (referred to herein as the "filler") dispersed therein. As illustrated in FIG. 1, in typical articles (20) comprising filled compositions, the filler 10 (represented by the multitude of specks in this and the other figures) is dispersed at least substantially uniformly throughout the matrix 12. In the articles of the present invention the filler is dispersed in the matrix such that there is a compositional gradient in which the concentration of the filler varies throughout the matrix.

Figure 2:
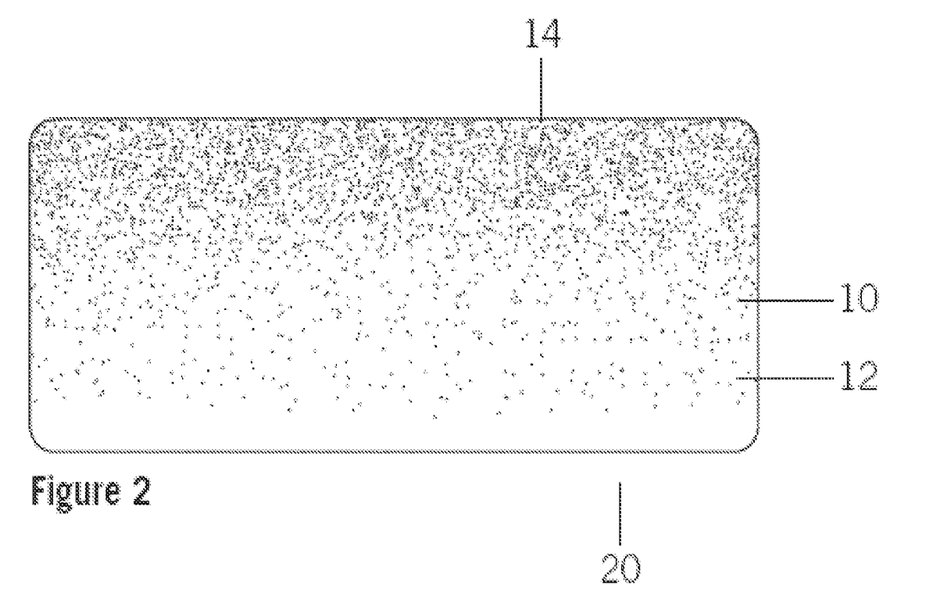
FIGS. 2 to 5 are idealized cross-sectional views of articles of present invention.
Figure 3:
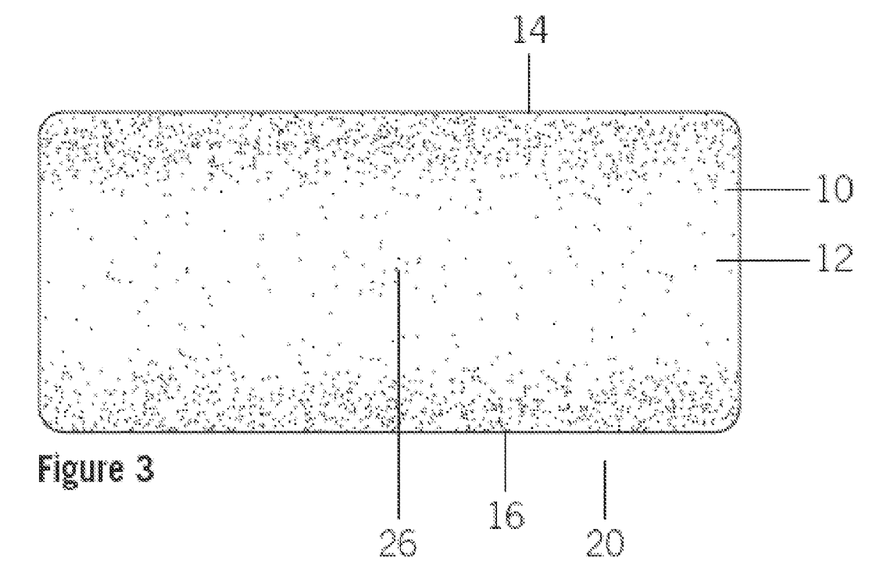

The compositional gradient is preferably such that the concentration of the filler increases or decreases in one or more directions across the article. For example, as illustrated in FIG. 2, there may be a gradient in which the amount of filler 10 is concentrated in the matrix 12 near a surface 14 of the article 20, or, as shown in FIG. 3, there may be a gradient in which the amount of filler 10 in article 20 is concentrated in the matrix 12 towards two or more surfaces 14 and 16 relative to 26, an interior portion of the article or a portion of the article situated between the surfaces.

Figure 4:
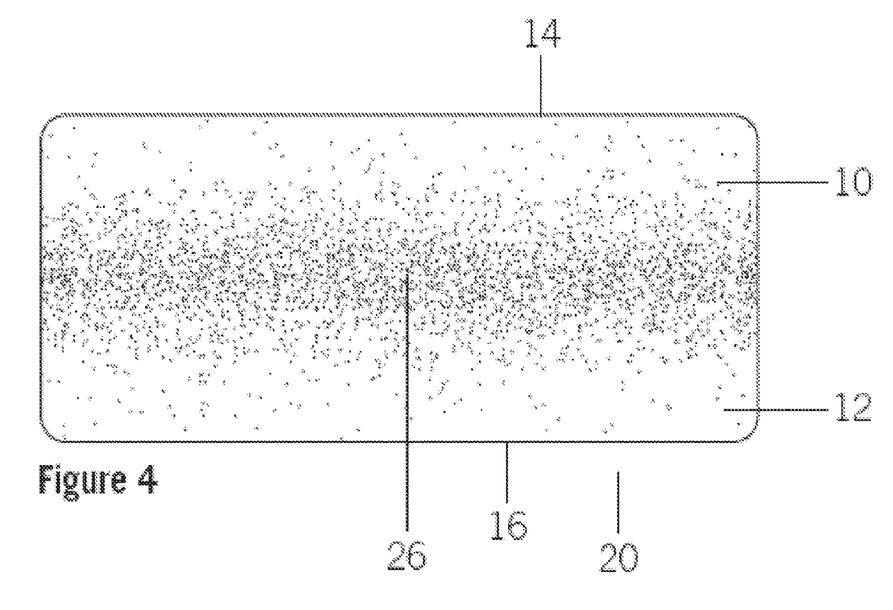
Figure 5:
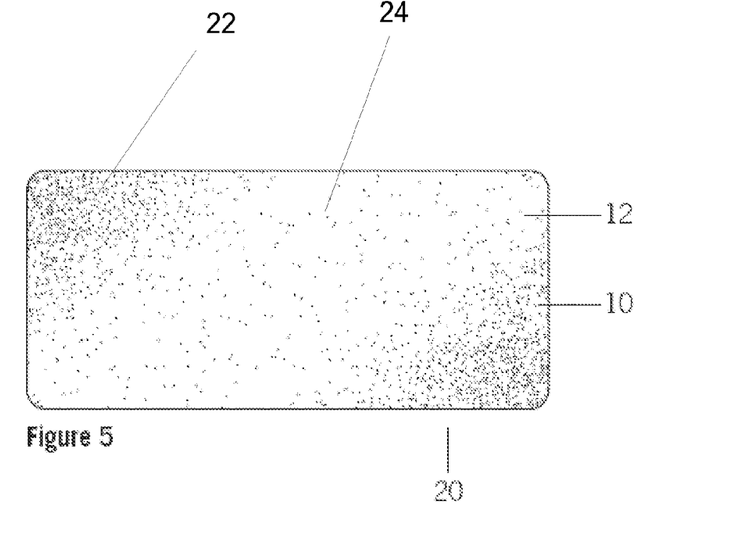

In another embodiment, as illustrated in FIG. 4, the filler 10 in article 20 may be concentrated in the matrix 12 away from the surfaces 14 and 16 and towards 26, an interior portion of the article and/or a portion of the article between the surfaces. As shown in FIG. 5, the amount of filler 10 in the article 20 may also be concentrated in the matrix 12 both towards a surface in a portion 22 of the article and away from that surface in an adjacent portion 24 of the article.

In a preferred embodiment of the invention, the filler is concentrated near a surface of the article. The gradient itself may or may not be uniform across all or a part or the article and need not take on any particular form (the concentration of the filler need not vary linearly, for example).

The articles of the invention are monolithic, meaning that they are formed of a single composite material, without joints, seams, or the like. They are not, for example, in the form of laminates or the like. The articles may be present as a component of a larger structure. They may be films, coatings, and the like adhered to or otherwise in contact with one or more other articles. They may be overmolded onto one or more other components or other components may be overmolded onto the article of the present invention. Other components may be attached to the articles of the present invention mechanically (such as by fasteners), by welding (such as ultrasonic welding, laser welding, vibration welding, or the like), by gluing, or any other suitable method. Additional components may include wires, films, tapes, circuit components, electrical and electronic components, and the like.

The articles may be in any suitable form, including molded articles, extruded shapes or sheets, films, and the like.

The articles may be made using any suitable method, including, but not limited to, molding (including, but not limited to, injection molding, compression molding, rotational molding, and the like), solution casting, melt casting, and the like.

The concentration gradient may be achieved using any suitable method. In one embodiment of the invention, the surface of a mold, casting surface, etc. (referred to herein generally as the "mold face") is selected such that the carbonaceous filler has a relatively greater affinity for the mold face than the matrix polymer or that the matrix polymer has a relatively greater affinity for the mold face than the carbonaceous filler. These relative affinities could be a result of different surface (interfacial) energies of the filler and polymer with the mold face (e.g., mold surface, casting surface, etc.).

Figure 6:
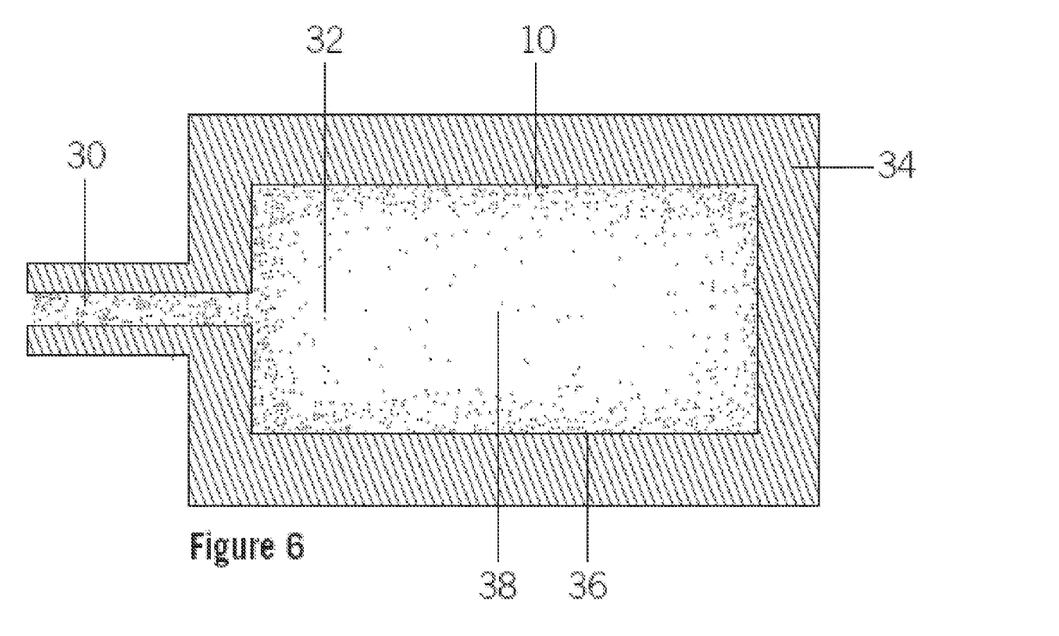
FIG. 6 is an idealized cross-sectional view of a mold into which a matrix polymer/filler melt has been injected to form an article of the present invention.

For example, as shown in FIG. 6, a molten matrix polymer/carbonaceous filler blend 30 is injected into the cavity 32 of a mold 34 having a face 36 made of a material for which the carbonaceous filler 10 has a greater affinity than does the matrix polymer 38. The filler 10 is present in a concentration gradient that increases in the direction of face 36.

The face may be a metallic material such as steel, steel alloys, stainless steel, aluminum, brass, metal oxides, and the like. The mold face may also be a mineral such as, but not limited to, glass, or one or more polymers such as, but not limited to, fluoropolymers (e.g., tetrafluoroethylene), polyolefins (e.g. polyethylene, polypropylene, etc.), or the like. Different parts of the mold face may be made of different materials to provide articles having different concentration gradients in different regions.

In another embodiment of the invention, the relative affinities may be adjusted by modifying the carbonaceous filler by, for example, functionalizing its surface covalently or non-covalently with any suitable functional groups, including, but not limited to, alkanes, alkenes, alkynes, alicyclic groups, aromatic groups, hydroxyl groups, epoxides, carboxylic acids, carboxylic acid salts, esters, anhydrides, amines, amides, imides, halogens, ammonium salts, silanes, siloxanes, sulphates, sulphonates, and the like.

For example, polar functional groups, such as oxygen- or nitrogen-containing groups (for example, epoxides and/or hydroxyl groups or amine groups) could increase the affinity of the filler for materials such as glass, stainless steel, aluminum, and the like relative to a less polar matrix polymer. Alternatively, the use of non-polar functional groups such as hydrocarbons or less extensively functionalized carbonaceous fillers could increase the affinity of the filler for less polar materials (such as fluoropolymers) relative to the polymer.

In a further embodiment of the invention, surfactants may be used to modify the relative affinities. For example, surfactants with polar or ionic head groups could adhere or otherwise be attracted to mold faces made from polar materials (such as metals, metal oxides, polar polymers, and the like). The tail of the surfactant can be chosen to match the surface chemistry of the carbonaceous filler, and will thus draw the filler towards the surface. Alternatively, the surfactant can be selected such that the head adheres or is otherwise attracted to the filler and the tail is compatible with the mold face.

In another embodiment, gravity can be used to create or enhance the gradient. For example, the filler can be suspended in a solution and/or suspension/dispersion containing the polymer, which is then cast or otherwise applied to a mold face comprising an appropriate material. Settling of the filler leads to an increased concentration of the filler towards the mold face.

In an additional embodiment, the use of a centrifuge to mold or cast a melt or liquid suspension or mixture can also be used to create or enhance the gradient.

The filler may also be dispersed or suspended in the presence of a solution and/or dispersion/suspension containing monomers and/or oligomers or a mixture of a combination of polymers, monomers, and/or oligomers. Initiators, cross-linking agents, and the like may also be present. In such cases, any appropriate method of forming the gradient, including those described above, may be used to form the gradient. The monomers and/or oligomers may then be polymerized to form the articles of the invention. The gradient may also be formed in whole or in part during the polymerization.

Cross-linking and/or other curing agents may also be present in the matrix and the matrix may be curing during or after the formation of the gradient. Curing may also be accomplished using radiation or other means. Crosslinking may be done by a free radical or other process. Any suitable crosslinking method may be used, such as radical initiator, radiation, electron beam, thermal, etc.

Radical initiators may be activated thermally, by radiation (such as UV radiation), a combination of two or more methods, etc.

Thermal cross linking may also be done in stages where, for example, the temperature is held at a certain point for a given period of time and then raised or lowered for another period of time. The temperature may also be ramped during the curing. Thermal and UV radiation cross-linking and/or other methods may be combined.

Radical initiators may include radical polymerization initiators, radical sources, etc., including organic and inorganic compounds. Examples include organic and inorganic peroxides (such as hydrogen peroxide, dialkyl peroxides, hydroperoxides, peracids, diacyl peroxides, peroxy esters, ketone peroxides, hydrocarbon peroxides, organometallic peroxides, organic polyoxides, organic polyoxides, dialkyl trioxides, hydrotrioxides, tetroxides, alkali metal peroxides (such as lithium peroxide), etc.), azo compounds, polyphenylhydrocarbons, substituted hydrazines, alkoxyamines, nitrocompounds, nitrates, nitrites, nitroxides, disulfides, polysulfides, persulfates (e.g. potassium persulfate, etc.), etc.

Examples of peroxides include, but are not limited to dibenzoyl peroxide, dicumyl peroxide, acetone peroxide, methyl ethyl ketone peroxide, lauroyl peroxide, tert-butyl peroxide, tert-butyl peracetate, di-tert-amyl peroxide, tert-butyl hydroperoxide, cumene hydroperoxide, 1,3-bis-(tert-butylperoxy-1-propyl)benzene, bis-(tert-butylperoxy) valerate, bis-(2,4-dichlorobenzoyl) peroxide, etc.

Examples of azo compounds include azobisisobutylonitrile (AIBN); 1,1'-azobis(cyclohexanecarbonitrile) (ABCN); 2,2'-azobis(2-methylbutyronitrile); 2,2'-azobis(2-methylpropionitrile); 2,2'-azobis(2-methylpropionitrile); N-tert-butyl-N-(2-methyl-1-phenylpropyl)-O-(1-phenylethyl)hydroxylamine, etc.

One or more crosslinking promoters or coagents may be used. Examples include multifunctional (e.g. those containing at least two unsaturated radical polymerizable functional groups such as vinyl and other alkenyl groups) small molecules, oligomers, and polymers, etc. These may include, but are not limited to difunctional and trifunctional monomers; polybutadienes (including polybutadiene diacrylates, high vinyl polybutadiene, low molecular weight hydroxyl terminated polybutadienes and their esters, and the like); and diols, glycols, and polyethers (such as 1,4-butanediol, 1,6-hexanediol, poly(ethylene glycols), di(methylene glycol), di(ethylene glycol), di(butylene glycol), tri(propylene glycol), cyclohexanediols, 1,3-butylene glycol, etc.) that are terminated and/or otherwise substituted with two or more unsaturated radical polymerizable groups such as acrylates and methacrylates (examples of which include those manufactured by Sartomer Co., Inc., Exton Penna.). Examples also include di- and triallyl compounds, diacrylates and dimethacrylates, trifunctional (meth)acrylate esters, etc., such as N—N'-m-phenylenedimaleidmide, triallyl cyanurate (TAC), triallyl isocyanurate (TAIC), poly(butadiene) diacrylate, trimethylolpropane tri(meth)acrylate (TMPT), calcium di(meth)acrylate, trimethylolpropane tri(meth)acrylate, etc.

Preferred carbonaceous fillers are materials that comprise at least 50 mole percent, or more preferably, at least about 60 mole percent, or still more preferably at least about 70 mole, or yet more preferably at least about 80 mole percent, or further more preferably at least about 90 mole percent carbon.

Examples of carbonaceous fillers include, but are not limited to, functionalized graphene sheets, graphite (including natural, Kish, and synthetic/pyrolytic, highly-oriented pyrolytic, etc. graphites), graphitized carbon, carbon black, carbon fibers and fibrils, carbon whiskers, vapor-grown carbon nanofibers, metal coated carbon fibers, carbon nanotubes (including single- and multi-walled), nanosized graphene sheets, graphite oxide, activated carbon, carbon fibers, expanded graphite, expandable graphite, hollow carbon spheres, carbon foams, and the like.

The surface of the carbonaceous filler may be modified by, for example, functionalizing its surface covalently or non-covalently with any suitable functional groups, including, but not limited to, alkanes, alkenes, alkynes, alicyclic groups, aromatic groups, hydroxyl groups, epoxides, carboxylic acids, carboxylic acid salts, esters, anhydrides, amines, amides, imides, halogens, ammonium salts, silanes, siloxanes, sulphates, sulphonates, and the like.

A preferred carbonaceous filler is functionalized graphene sheets (also referred to herein as "FGS"). Preferred functionalized graphene sheets include graphene and high surface area functionalized graphene sheets.

The FGS are graphite sheets preferably having a surface area of from about 100 to about 2630 $m^2/g$, or more preferably of from about 200 to about 2630 $m^2/g$, or yet more preferably of from about 300 to about 2630 $m^2/g$. In some embodiments of the present invention, the FGS primarily, almost completely, or completely comprise fully exfoliated single sheets of graphite (often referred to as "graphene"), while in other embodiments, they may comprise partially exfoliated graphite sheets, in which two or more sheets of graphite have not been exfoliated from each other. The FGS may comprise mixtures of fully and partially exfoliated graphite sheets.

They may be obtained from graphite, graphite oxide, expandable graphite, expanded graphite, etc. They may be obtained by the physical exfoliation of graphite, by for example, peeling off sheets graphene sheets. They may be made from inorganic precursors, such as silicon carbide. They may be made by chemical vapor deposition (such as by reacting methane and hydrogen on a metal surface). They may be may by the reduction of an alcohol, such ethanol, with a metal (such as an alkali metal like sodium) and the subsequent pyrolysis of the alkoxide product (such a method is reported in *Nature Nanotechnology* (2009), 4, 30-33). The FGS may be made by exfoliating graphite. Graphite may be treated with oxidizing and intercalating agents and exfoliated. Graphite may also be treated with intercalating agents and electrochemically oxidized and exfoliated. Graphene sheets may be formed by ultrasonically exfoliating suspensions of graphite and/or graphite oxide in a liquid (which may contain surfactants and/or intercalants). Exfoliated graphite oxide dispersions or suspensions can be subsequently reduced to graphene sheets. Graphene sheets may be made by the exfoliation of expandable graphite, followed by intercalation, and ultrasonication or other means of separating the intercalated sheets (see, for example, *Nature Nanotechnology* (2008), 3, 538-542). Graphene sheets may also be formed by mechanical treatment (such as grinding or milling) to exfoliate graphite or graphite oxide (which would subsequently be reduced to graphene sheets).

Reduction of graphite oxide to graphene may be by means of chemical reduction and may be carried out in graphite oxide in a solid form, in a dispersion, etc. Examples of useful chemical reducing agents include, but are not limited to, hydrazines (such as hydrazine, N,N-dimethylhydrazine, etc.), sodium borohydride, hydroquinone, isocyanates (such as phenyl isocyanate), hydrogen, hydrogen plasma, etc. For example, a dispersion of exfoliated graphite oxide in a carrier (such as water, organic solvents, or a mixture of solvents) can be made using any suitable method (such as ultrasonication and/or mechanical grinding or milling) and reduced to graphene sheets.

Preferred methods of exfoliation include thermal exfoliation and ultrasonication of suspensions. The graphite may be any suitable type, including natural, Kish, and synthetic graphites and graphitic materials such as graphitic carbon fibers (including those derived from polymers), and highly oriented pyrolytic graphite.

In a preferred method for the preparation of FGS, graphite is oxidized to graphite oxide, which is then thermally exfoliated to form high surface area FGS that are in the form of thermally exfoliated graphite oxide, as described in US 2007/0092432, the disclosure of which is hereby incorporated herein by reference. The thusly formed thermally exfoliated graphite oxide may display little or no signature corresponding to graphite or graphite oxide in its X-ray diffraction patterns.

Graphite oxide may be produced by any method known in the art, such as by a process that involves oxidation of graphite using one or more chemical oxidizing agents and, optionally, intercalating agents such as sulfuric acid. Examples of oxidizing agents include nitric acid, sodium and potassium nitrates, perchlorates, hydrogen peroxide, sodium and potassium permanganates, phosphorus pentoxide, bisulfites, and the like. Preferred oxidants include $KClO_4$; $HNO_3$ and $KClO_3$; $KMnO_4$ and/or $NaMnO_4$; $KMnO_4$ and $NaNO_3$; $K_2S_2O_8$ and $P_2O_5$ and $KMnO_4$; $KMnO_4$ and $HNO_3$; and $HNO_3$. A preferred intercalation agent includes sulfuric acid. Graphite may also be treated with intercalating agents and electrochemically oxidized. Examples of methods of making graphite oxide include those described by Staudenmaier (*Ber. Stsch. Chem. Ges.* (1898), 31, 1481) and Hummers (*J. Am. Chem. Soc.* (1958), 80, 1339).

Thermal exfoliation may be carried out in a continuous, semi-continuous batch, etc. process.

Heating can be done in a batch process or a continuous process and can be done under a variety of atmospheres, including inert and reducing atmospheres (such as nitrogen, argon, and/or hydrogen atmospheres). Heating times can range from under a few seconds or several hours or more, depending on the temperatures used and the characteristics desired in the final thermally exfoliated graphite oxide. Heating can be done in any appropriate vessel, such as a fused silica or a mineral or ceramic vessel or a metal vessel.

During heating, the graphite oxide may be contained in an essentially constant location in single batch reaction vessel, or may be transported through one or more vessels during the reaction in a continuous or batch mode. Heating may be done using any suitable means, including the use of furnaces and infrared heaters.

Examples of temperatures at which the thermal exfoliation of graphite oxide may be carried out are at least about 300° C., at least about 400° C., at least about 450° C., at least about 500° C., at least about 600° C., at least about 700° C., at least about 750° C., at least about 800° C., at least about 850° C., at least about 900° C., at least about 950° C., and at least about 1000° C. Preferred ranges include between about 750 about and 3000° C., between about 850 and 2500° C., between about 950 and about 2500° C., and between about 950 and about 1500° C.

The time of heating can range from less than a second to many minutes. For example, the time of heating can be less than about 0.5 seconds, less than about 1 second, less than about 5 seconds, less than about 10 seconds, less than about 20 seconds, less than about 30 seconds, or less than about 1 min. The time of heating can be at least about 1 minute, at least about 2 minutes, at least about 5 minutes, at least about 15 minutes, at least about 30 minutes, at least about 45 minutes, at least about 60 minutes, at least about 90 minutes, at least about 120 minutes, at least about 150 minutes, at least about 240 minutes, from about 0.01 seconds to about 240 minutes, from about 0.5 seconds to about 240 minutes, from about 1 second to about 240 minutes, from about 1 minute to about 240 minutes, from about 0.01 seconds to about 60 minutes, from about 0.5 seconds to about 60 minutes, from about 1 second to about 60 minutes, from about 1 minute to about 60 minutes, from about 0.01 seconds to about 10 minutes, from about 0.5 seconds to about 10 minutes, from about 1 second to about 10 minutes, from about 1 minute to about 10 minutes, from about 0.01 seconds to about 1 minute, from about 0.5 seconds to about 1 minute, from about 1 second to about 1 minute, no more than about 600 minutes, no more than about 450 minutes, no more than about 300 minutes, no more than about 180 minutes, no more than about 120 minutes, no more than about 90 minutes, no more than about 60 minutes, no more than about 30 minutes, no more than about 15 minutes, no more than about 10 minutes, no more than about 5 minutes, no more than about 1 minute, no more than about 30 seconds, no more than about 10 seconds, or no more than about 1 second. During the course of heating, the temperature may vary.

Examples of the rate of heating include at least about 120° C./min, at least about 200° C./min, at least about 300° C./min, at least about 400° C./min, at least about 600° C./min, at least about 800° C./min, at least about 1000° C./min, at least about 1200° C./min, at least about 1500° C./min, at least about 1800° C./min, and at least about 2000° C./min.

Graphene sheets may be annealed or reduced to graphene sheets having higher carbon to oxygen ratios by heating under reducing atmospheric conditions (e.g., in systems purged with inert gases or hydrogen). Reduction/annealing temperatures are preferably at least about 300° C., or at least about 350° C., or at least about 400° C., or at least about 500° C., or at least about 600° C., or at least about 750° C., or at least about 850° C., or at least about 950° C., or at least about 1000° C. The temperature used may be, for example, between about 750 about and 3000° C., or between about 850 and 2500° C., or between about 950 and about 2500° C.

The time of heating can be for example, at least about 1 second, or at least about 10 second, or at least about 1 minute, or at least about 2 minutes, or at least about 5 minutes. In some embodiments, the heating time will be at least about 15 minutes, or about 30 minutes, or about 45 minutes, or about 60 minutes, or about 90 minutes, or about 120 minutes, or about 150 minutes. During the course of annealing/reduction, the temperature may vary within these ranges.

The heating may be done under a variety of conditions, including in an inert atmosphere (such as argon or nitrogen) or a reducing atmosphere, such as hydrogen (including hydrogen diluted in an inert gas such as argon or nitrogen), or under vacuum. The heating may be done in any appropriate vessel, such as a fused silica or a mineral or ceramic vessel or a metal vessel. The materials being heated including any starting materials and any products or intermediates) may be contained in an essentially constant location in single batch reaction vessel, or may be transported through one or more vessels during the reaction in a continuous or batch reaction. Heating may be done using any suitable means, including the use of furnaces and infrared heaters.

The FGS used in the present invention preferably have a surface area of at least about 100 $m^2/g$ to, or of at least about 200 $m^2/g$, or of at least about 300 $m^2/g$, or of least about 350 $m^2/g$, or of least about 400 $m^2/g$, or of least about 500 $m^2/g$, or of least about 600 $m^2/g$., or of least about 700 $m^2/g$, or of least about 800 $m^2/g$, or of least about 900 $m^2/g$, or of least about 700 $m^2/g$ or of from about 300 to about 2630 $m^2/g$, or of from about 350 to about 2400 $m^2/g$, or of from about 400 to about 2400 $m^2/g$, or of from about 500 to about 2400 $m^2/g$. In another embodiment, the surface area is about 300 to about 1100 $m^2/g$. A single graphite sheet has a maximum calculated surface area of 2630 $m^2/g$. The surface area includes all values and subvalues therebetween, especially including 400, 500, 600, 700, 800, 900, 100, 110, 1200, 1300, 1400, 1500, 1600, 1700, 1800, 1900, 2000, 2100, 2200, 2300, 2400, and 2500 $m^2/g$.

The graphene sheets can have number average aspect ratios of about 100 to about 100,000, or of about 100 to about 50,000, or of about 100 to about 25,000, or of about 100 to about 10,000 (where "aspect ratio" is defined as the ratio of the longest dimension of the sheet to the shortest).

Surface area can be measured using either the nitrogen adsorption/BET method at 77 K or a methylene blue (MB) dye method.

The dye method is carried out as follows: A known amount of FGS is added to a flask. At least 1.5 g of MB are then added to the flask per gram of FGS. Ethanol is added to the flask and the mixture is ultrasonicated for about fifteen minutes. The ethanol is then evaporated and a known quantity of water is added to the flask to re-dissolve the free MB. The undissolved material is allowed to settle, preferably by centrifuging the sample. The concentration of MB in solution is determined using a UV-vis spectrophotometer by measuring the absorption at $\lambda_{max}$=298 nm relative to that of standard concentrations.

The difference between the amount of MB that was initially added and the amount present in solution as determined by UV-vis spectrophotometry is assumed to be the amount of MB that has been adsorbed onto the surface of the FGS. The surface area of the FGS are then calculated using a value of 2.54 $m^2$ of surface covered per one mg of MB adsorbed.

The FGS preferably have a bulk density of from about 40 to about 0.1 $kg/m^3$. The bulk density includes all values and subvalues therebetween, especially including 0.5, 1, 5, 10, 15, 20, 25, 30, 35 $kg/m^3$.

The FGS typically have an overall carbon to oxygen molar ratio (C/O ratio), as determined by elemental analysis of at least about 1:1, or more preferably, at least about 3:2. Examples of carbon to oxygen ratios include about 3:2 to about 85:15; about 3:2 to about 20:1; about 3:2 to about 30:1; about 3:2 to about 40:1; about 3:2 to about 60:1; about 3:2 to about 80:1; about 3:2 to about 100:1; about 3:2 to about 200:1; about 3:2 to about 500:1; about 3:2 to about 1000:1; about 3:2 to greater than 1000:1; about 10:1 to about 30:1; about 80:1 to about 100:1; about 20:1 to about 100:1; about 20:1 to about 500:1; about 20:1 to about 1000:1. In some embodiments of the invention, the carbon to oxygen ratio is at least about 10:1, or at least about 20:1, or at least about 35:1, or at least about 50:1, or at least about 75:1, or at least about 100:1, or at least about 200:1, or at least about 300:1, or at least about 400:1, or at least about 500:1, or at least about 750:1, or at least about 1000:1; or at least about 1500:1, or at least about 2000:1. The carbon to oxygen ratio also includes all values and subvalues between these ranges.

The graphene sheets may contain atomic scale kinks. These kinks may be caused by the presence of lattice defects in, or by chemical functionalization of the two-dimensional hexagonal lattice structure of the graphite basal plane.

The matrix may further optionally comprise electrically conductive fillers other than the carbonaceous filler, such as metals (including metal alloys), conductive metal oxides, polymers, and metal-coated materials. These components can take a variety of forms, including particles, powders, flakes, foils, needles, etc.

Examples of metals include, but are not limited to silver, copper, aluminum, platinum, palladium, nickel, chromium, gold, bronze, and the like. Examples of metal oxides include antimony tin oxide and indium tin oxide and materials such as fillers coated with metal oxides. Metal and metal-oxide coated materials include, but are not limited to metal coated carbon and graphite fibers, metal coated glass fibers, metal coated glass beads, metal coated ceramic materials (such as beads), and the like. These materials can be coated with a variety of metals, including nickel.

Examples of electrically conductive polymers include, but are not limited to, polyacetylene, polyethylene dioxythiophene (PEDOT), poly(styrenesulfonate) (PSS), PEDOT:PSS copolymers, polythiophene and polythiophenes, poly (3-alkylthiophenes), poly(2,5-bis(3-tetradecylthiophen-2-yl)thieno[3,2-b]thiophene) (PBTTT), poly (phenylenevinylene), polypyrene, polycarbazole, polyazulene, polyazepine, polyfluororenes, polynaphtalene, polyisonaphthalene, polyaniline, polypyrrole, poly (phenylene sulfide), copolymers of one or more of the foregoing, etc., and their derivatives and copolymers. The conductive polymers may be doped or undoped. They may be doped with boron, phosphorous, iodine, etc.

The matrix may comprise additional additives, such as other fillers and reinforcing agents (such as glass fibers and mineral fibers such as wollastonite), tougheners and impact modifiers, flame retardants, plasticizers, antioxidants, UV stabilizers, heat stabilizers, lubricants, mold release agents, colorants, and the like.

The matrix comprises one or more polymers, including thermoplastics, thermosetting polymers, and non-melt processable polymers and/or polymerizable species.

Examples of thermoplastics include, but are not limited to, polyolefins (such as polyethylene, linear low density polyethylene (LLDPE), low density polyethylene (LDPE), polypropylene, and olefin copolymers), styrene/butadiene rubbers (SBR), styrene/butadiene/styrene copolymers (SBS), styrene/isoprene/styrene copolymers (SIS), styrene/ethylene/butadiene/styrene copolymers (SEBS), butyl rubbers, ethylene/propylene copolymers (EPR), ethylene/propylene/diene monomer copolymers (EPDM), polystyrene (including high impact polystyrene), poly(vinyl acetates), ethylene/vinyl acetate copolymers (EVA), poly(vinyl alcohols), ethylene/vinyl alcohol copolymers (EVOH), poly (vinyl butyral), poly(methyl methacrylate) and other acrylate polymers, acrylonitrile/butadiene/styrene (ABS), styrene/acrylonitrile polymers (SAN), poly(ethylene oxide), poly(propylene oxide), poly(acrylonitrile), polycarbonates (PC), polyamides, polyesters, liquid crystalline polymers (LCPs), poly(lactic acid), poly(phenylene oxide) (PPO), PPO-polyamide alloys, polysulphone (PSU), polyetherketone (PEK), polyetheretherketone (PEEK), polyimides, polyoxymethylene (POM) homo- and copolymers, polyetherimides, fluorinated ethylene propylene polymers (FEP), poly(vinyl fluoride), poly(vinylidene fluoride), poly (vinylidene chloride), poly(vinyl chloride), and elastomers.

Examples of polyesters include, but are not limited to, poly(butylene terephthalate) (PBT), poly(ethylene terephthalate) (PET), poly(1,3-propylene terephthalate) (PPT), poly(ethylene naphthalate) (PEN), and poly(cyclohexanedimethanol terephthalate) (PCT)).

Examples of polyamides include, but are not limited to aliphatic polyamides (such as polyamide 4,6; polyamide 6,6; polyamide 6; polyamide 11; polyamide 12; polyamide 6,9; polyamide 6,10; polyamide 6,12; polyamide 10,10; polyamide 10,12; and polyamide 12,12), alicyclic polyamides, and aromatic polyamides (such as poly(m-xylylene adipamide) (polyamide MXD,6) and polyterephthalamides such as poly(dodecamethylene terephthalamide) (polyamide 12,T), poly(decamethylene terephthalamide) (polyamide 10,T), poly(nonamethylene terephthalamide) (polyamide 9,T), the polyamide of hexamethylene terephthalamide and hexamethylene adipamide, and the polyamide of hexamethyleneterephthalamide, and 2-methylpentamethyleneterephthalamide).

Examples of elastomers include, but are not limited to, polyurethanes, thermoplastic polyurethanes, copolyetheresters, rubbers (including butyl rubbers and natural rubbers), styrene/butadiene copolymers, styrene/butadiene/styrene copolymers (SBS), styrene/isoprene/styrene copolymers (SIS), nitrile butadiene rubbers (NBR), hydrogenated nitrile butadiene rubbers (HNBR), styrene/ethylene/butadiene/styrene copolymers (SEBS), polyisoprenes, ethylene/propylene copolymers (EPR), ethylene/propylene/diene monomer copolymers (EPDM), polysiloxanes, and polyethers (such as poly(ethylene oxide), poly(propylene oxide), and their copolymers).

Examples of thermosetting polymers include, but are not limited to polyurethanes, epoxy polymers, and alkyds.

The polymers may also be aramides, polytetrafluoroethylene (PTFE), non-thermoplastic polyimides, and the like.

The articles may be made using any suitable method, such as melt processing and casting. Examples of processing techniques include, but are not limited to, injection molding, extrusion, coextrusion, rotational molding, blow molding, injection blow molding, thermoforming, solution casting, printing, painting, spinning, reaction injection molding, and the like.

The articles may be made by using liquid injection molding (such as with liquid silicone rubbers) wherein a liquid is injected into a mold and subsequently cures or otherwise hardens or solidifies, taking on the form of the mold. Multipart systems may be used, such as in reaction injection molding techniques.

The articles may be in form of molded articles (including, but not limited to, injection molded articles, rotational molded articles, blow molded articles, and the like), sheets, films, fibers, filaments, tubes, coatings, inks, and the like.

Two or more sides of the article may have different properties (e.g., one side is electrically insulating and another is electrically conductive and/or one side is thermally insulating and another is thermally conductive). The article may also be designed such that an electrically and/or thermally conductive region (such as a layer) is surrounded or sandwiched by two or more nonconductive regions (such as layers) or that an electrically and/or thermally insulating region (such as a layer) is surrounded or sandwiched by two or more conductive regions (such as layers). Such an article may be used to preferably conduct or channel electricity and/or heat longitudinally relative to a transverse direction.

The articles may be used in or as devices that serve as thermal signatures or detectors.

The articles may have graded mechanical properties. For example, the rigidity of the article in given portion of its volume may vary with the concentration of the filler. Such articles may be used to absorb or dampen vibrations and other forces. Examples include, but are not limited to projectile impact armor, vehicular collision impact absorption components, sporting (such as tracks, courts, fields, etc), rifle and pistol stocks and handles, vibration dampening equipment in construction tools (e.g. hammer drills, pile drivers, jack hammers, and the like).

The mold face may be patterned (such as by printing) such that some portions of a surface of the article have a greater concentration of filler than others. The pattern may be in the form of a electrical circuit, for example, where the lines of the circuit are electrically conductive and the areas therebetween are insulating. The article or structure comprising the article can be in the form of a sheet having an electrical circuit on its surface. Examples of articles include antennae, switches, contacts, logic circuits, wires, sensors, and the like.

The mold face may also be patterned by forming indentations, which can create surface markings or textures on the article. These can be in the form of heat sinks or components of heat sinks, for example.

The articles or structures comprising the articles can be in the form of a film that is permeation resistant to materials such as gases and liquids (such as water, alcohols, hydrocarbons, and/or other solvents).

The articles or structures comprising the articles can be in the form of a shaped memory device or thermocouple. For example, the matrix can be selected such that it expands and/or deforms upon heating. If a filler that inhibits the expansion and/or deformation of the matrix is concentrated towards one surface of the article or structure, when heated, the article can bend. The bent article or structure may have enhanced or decreased electrical and/or thermal conductivity relative to the unbent article.

The articles or structures comprising the articles may be in the form of devices in which certain areas swell, bend, or otherwise deform or change in shape upon exposure to a chemical such as a solvent, water, etc.

The articles or structures comprising the articles may be in the form of chemical sensors.

The article or structure comprising the article may be in the form of a hose, tube, pipe, container, bottle, tank, or the like or may form one or more layers of a multilayered hose, tubes, pipe, container, bottle, tank, or the like.

The articles or structures comprising the articles may be in the form of tanks (for gases, liquids, or the like, and including fuel tanks for vehicles and other fuel-powered devices), beverage bottles, cryotanks, pressure vessels, and the like.

The articles or structures comprising the articles may be in the form of fuel and fuel system components.

The articles or structures comprising the articles can be in the form of an electrically conducting device and/or an electrostatically painted article or structure.

By the use of the term "electrically conductive" to refer to a region or portion of the article, it is meant that the region or portion being referred to preferably has a conductivity of at least about $10^{-8}$ S/m. They may have a conductivity of about $10^{-6}$ S/m to about $10^5$ S/m, or of about $10^{-5}$ S/m to about $10^5$ S/m. In other embodiments of the invention, it has a conductivity of at least about 0.001 S/m, of at least about 0.01 S/m, of at least about 0.1 S/m, of at least about 1 S/m, of at least about 10 S/m, of at least about 100 S/m, or at least about 1000 S/m, or at least about $10^4$ S/m, or at least about $10^5$ S/m, or at least about $10^6$ S/m.

By the use of the term "thermally conductive" to refer to a region or portion of the article, it is meant that the region or portion being referred to preferably has a thermal conductivity of at least about 0.1 W/mK, or of at least about 0.5 W/mK. It can have a thermal conductivity of about 0.1 to about 50 W/(m-K), or of about 0.5 to about 30 W/(m-K), or of about 1 to about 30 W/(m-K), or of about 1 to about 20 W/(m-K), or of about 1 to about 10 W/(m-K), or of about 1 to about 5 W/(m-K), or of about 2 to about 25 W/(m-K), or of about 5 to about 25 W/(m-K).

EXAMPLES

Example 1

A melt-mixed blend of functionalized graphene sheets (4 weight percent) and styrene-butadiene-styrene copolymer (SBS) (96 weight percent) is prepared at about 155° C. in a Banbury-style mixer. The resulting composition is added to THF, resulting in a suspension of the graphene sheets in a solution of the SBS. The suspension is cast onto a glass surface to form a film.

The resistance of the side of the film facing the glass surface is about 625 ohms/square and the resistance of the side of the film facing away from the glass surface is about 1740 ohms/square. The resistance is measured using a digital multimeter across contact points situated about 1 cm apart.

Examples 2-7

Functionalized graphene sheets (40 weight percent) and ethylene/acrylic acid copolymer (A-C® 5120, supplied by Honeywell) are combined in Electron (a citrus terpene-based solvent manufactured by Ecolink, Tucker, Ga.) and ground for about six hours in a vertical ball mill using 3/16" stainless steel balls. The resulting dispersions are combined with dicumyl peroxide (if used) in a 1:1 ratio by weight relative to the polymer, and coagent (if used) (Saret 521; a difunctional methacrylate supplied by Sartomer) and blended in a high shear mixer (a homogenizer having a roto-stator overhead stirrer) operating at about 33,000 RPM for about three minutes. The compositions of each example are summarized in Table 1.

The resulting dispersions are printed onto either a silicone rubber or poly(ethylene terephthalate) (PET) substrate using a #28 50 µm wire rod. The printed substrates are placed wet in an oven at 135° C. and cured for 1 hour.

The bulk resistance of each film is measured using a standard digital multimeter across contact points situated about 1 inch apart. The adhesive surface of a 3M Post-It® note is adhered to the surface of the film and peeled off and the bulk resistance of the remaining film is measured. This process is repeated one or more times. The resulting bulk resistance measurements at each point are given in Table 2.

TABLE 1

|  | Ex. 2 | Ex. 3 | Ex. 4 | Ex. 5 | Ex. 6 | Ex. 7 |
|---|---|---|---|---|---|---|
| Dicumyl peroxide | no | yes | yes | no | yes | yes |
| Coagent | no | no | yes | no | no | yes |
| Substrate | PET | PET | PET | silicone | silicone | silicone |

TABLE 2

|  | Ex. 2 | Ex. 3 | Ex. 4 | Ex. 5 | Ex. 6 | Ex. 7 |
|---|---|---|---|---|---|---|
| Initial | 148 | 194 | 208 | 1070 | 459 | 183 |
| Peel 1 | 152 | 200 | 221 | 1220 | 493 | 189 |
| Peel 2 | 158 | 208 | 230 | 1430 | 549 | 192 |
| Peel 3 | 163 | 217 | 241 | — | 581 | 196 |
| Peel 4 | 169 | — | 251 | — | — | 203 |
| Peel 5 | 191 | — | — | — | — | 205 |
| Peel 6 | 200 | — | — | — | — | 212 |
| Peel 7 | 210 | — | — | — | — | 218 |
| Peel 8 | 222 | — | — | — | — | 224 |

All quantities are bulk resistances in Ω/square.

The invention claimed is:

1. An article comprising a composition comprising at least one polymeric binder and at least one carbonaceous filler, having a compositional gradient wherein the concentration of the filler is increased or decreased in at least one direction of the article, wherein the at least one carbonaceous filler includes functionalized graphene sheets having a carbon to oxygen molar ratio of at least about 15:1.

2. The article of claim 1, wherein the filler further comprises one or more fillers selected from the group consisting of graphite, carbon black, carbon fibers and fibrils, vapor-grown carbon nanofibers, metal coated carbon fibers, carbon nanotubes, nanosized graphene sheets, activated carbon, carbon fibers, expanded graphite, expandable graphite, hollow carbon spheres, and carbon foams.

3. The article of claim 1, wherein the binder comprises one or more elastomers.

4. The article of claim 3, wherein the elastomers are one or more selected from the group consisting of thermoplastic polyurethanes, copolyetheresters, rubbers, butyl rubbers, natural rubbers, styrene/butadiene copolymers, styrene/butadiene/styrene copolymers (SBS), styrene/isoprene/styrene copolymers (SIS), nitrile butadiene rubber (NBR), hydrogenated nitrile butadiene rubbers (HNBR), styrene/ethylene/butadiene/styrene copolymers (SEBS), polyisoprenes, ethylene/propylene copolymers (EPR), ethylene/propylene/diene monomer copolymers (EPDM), polysiloxanes, and polyethers.

5. The article of claim 1, wherein the binder comprises one or more polymers selected from the group consisting of polystyrene (including high impact polystyrene), poly(vinyl acetates), ethylene/vinyl acetate copolymers (EVA), poly(vinyl alcohols), ethylene/vinyl alcohol copolymers (EVOH), poly(vinyl butyral), poly(methyl methacrylate), acrylate polymers, acrylonitrile/butadiene/styrene (ABS), styrene/acrylonitrile polymers (SAN), poly(ethylene oxide), poly(propylene oxide), poly(acrylonitrile), polycarbonates (PC), polyamides, polyesters, liquid crystalline polymers (LCPs), poly(lactic acid), poly(phenylene oxide) (PPO), PPO-polyamide alloys, polysulphone (PSU), polyetherketone (PEK), polyetheretherketone (PEEK), polyimides, polyoxymethylene (POM) homo- and copolymers, polyetherimides, fluorinated ethylene propylene polymers (FEP), poly(vinyl fluoride), poly(vinylidene fluoride), poly(vinylidene chloride), and poly(vinyl chloride).

6. The article of claim 1, wherein the composition further comprises at least one electrically conductive fillers other than the carbonaceous filler.

7. The article of claim 6, wherein the filler is one or more fillers selected from the group consisting of metals, metal alloys, electrically conductive metal oxides, polymers, and metal-coated materials.

8. The article of claim 1, wherein the functionalized graphene sheets have a surface area of at least about 200 g/m$^2$.

9. The article of claim 1, wherein the functionalized graphene sheets have a surface area of at least about 300 g/m$^2$.

10. The article of claim 1, wherein the functionalized graphene sheets have a surface area of at least about 400 g/m$^2$.

11. The article of claim 1, wherein at least one surface of the article has an electrical conductivity of less than about $10^{-6}$ S/m.

12. The article of claim 1, wherein at least one surface of the article has an electrical conductivity of at least about $10^2$ S/m.

13. The article of claim 1, wherein at least one surface of the article has an electrical conductivity of at least about $10^4$ S/m.

14. The article of claim 1, wherein at least one surface of the article has a thermal conductivity of at least about 0.1 W/mK.

15. The article of claim 1, wherein at least one surface of the article has a thermal conductivity of at least about 0.5 W/mK.

16. The article of claim 1 in the form of a heat sink.

17. A structure comprising the article of claim 1 and at least one additional component.

18. The structure of claim 17 in the form of a printed electrical or electronic circuit.

* * * * *